US012134133B2

(12) United States Patent
Hens et al.

(10) Patent No.: US 12,134,133 B2
(45) Date of Patent: Nov. 5, 2024

(54) METHOD TO FORM COPPER NANOPARTICLES

(71) Applicant: Universiteit Gent, Ghent (BE)

(72) Inventors: Zeger Hens, Ghent (BE); Arnau Oliva Puigdomènech, Manresa (ES)

(73) Assignee: Universiteit Gent, Ghent (BE)

( * ) Notice: Subject to any disclaimer, the term of this patent is extended or adjusted under 35 U.S.C. 154(b) by 0 days.

(21) Appl. No.: 17/775,967

(22) PCT Filed: Nov. 19, 2020

(86) PCT No.: PCT/EP2020/082723
§ 371 (c)(1),
(2) Date: May 11, 2022

(87) PCT Pub. No.: WO2021/099486
PCT Pub. Date: May 27, 2021

(65) Prior Publication Data
US 2022/0388060 A1 Dec. 8, 2022

(30) Foreign Application Priority Data
Nov. 21, 2019 (EP) ..................................... 19210653

(51) Int. Cl.
*B22F 9/30* (2006.01)
*B22F 1/054* (2022.01)
(Continued)

(52) U.S. Cl.
CPC ................ *B22F 9/30* (2013.01); *B22F 1/054* (2022.01); *B22F 1/0545* (2022.01); *B22F 1/056* (2022.01);
(Continued)

(58) Field of Classification Search
CPC ....................................................... B22F 9/30
See application file for complete search history.

(56) References Cited

U.S. PATENT DOCUMENTS

| 2008/0138643 A1 | 6/2008 | Lee et al. | |
| 2008/0159902 A1* | 7/2008 | Shim | H05K 1/097 |
| | | | 977/932 |

(Continued)

FOREIGN PATENT DOCUMENTS

| CN | 106583712 B | 8/2018 |
| EP | 2671655 A1 | 12/2013 |

OTHER PUBLICATIONS

International Search Report for International Application No. PCT/EP2020/082723, mailed Jan. 15, 2021, 4 pages.
(Continued)

*Primary Examiner* — William D Young
(74) *Attorney, Agent, or Firm* — TraskBritt

(57) ABSTRACT

The invention relates to a method to form copper nanoparticles. The method comprises heating a solution comprising a copper precursor comprising at least one neat copper carboxylate in a concentration of at least 0.2 M, a stabilizer comprising an amine in a concentration equal or larger than the concentration of the copper precursor and optionally a solvent to a temperature T1 to form metallic copper. The solution is then heated to a temperature T2, with the temperature T2 being at least 10° C. higher than the temperature T1. The solution is heated from temperature T1 to temperature T2 with an average rate of at least 2 degrees per minute. The invention further relates to copper nanoparticles obtainable by such method and to formulations comprising such nanoparticles.

13 Claims, 4 Drawing Sheets

(51) Int. Cl.
B22F 1/0545 (2022.01)
B22F 9/06 (2006.01)
C08K 3/08 (2006.01)
C09D 11/52 (2014.01)

(52) U.S. Cl.
CPC ............... B22F 9/06 (2013.01); C08K 3/08 (2013.01); C09D 11/52 (2013.01); *B22F 2201/03* (2013.01); *B22F 2301/10* (2013.01); *C08K 2003/085* (2013.01)

(56) References Cited

U.S. PATENT DOCUMENTS

2017/0190930 A1* 7/2017 Lee ..................... C09D 11/037
2022/0037049 A1* 2/2022 Kikuchi ................. H01L 24/29

OTHER PUBLICATIONS

International Written Opinion for International Application No. PCT/EP2020/082723, mailed Jan. 15, 2021, 7 pages.
Kawamura et al. "Production of Oxidation-Resistant Cu-Based Nanoparticles by Wire Explosion" Scientific Reports (Dec. 2015) 5:18333. pp. 1-8.
Dai et al: "Self-Reducible Cu Nanoparticles for Conductive Inks" Ind. Eng. Chem. Reseach, vol. 57, No. 7 (Feb. 2018) pp. 2508-2516.
Effenberger et al: "Copper nanoparticles synthesized by thermal decomposition in liquid phase: the influence of capping ligands on the synthesis and bactericidal activity" Journal of Nanoparticle Research, vol. 16, No. 11 (Oct. 2014) pp. 1-10.
Lee et al. "Large-scale synthesis of copper nanoparticles by chemically controlled reduction for applications of inkjet-printed electronics." Nanotechnology 19 41 (Oct. 2008).
Lisiecki et al. "Control of the Shape and the Size of Copper Metallic Particles." The Journal of Physical Chemistry 100 (1996): 4160-4166.
Mott et al. "Synthesis of size-controlled and shaped copper nanoparticles" Langmuir, (May 2007) 8;23(10): pp. 5740-5745.
Muniz-Miranda et al. "Surface-enhanced Raman scattering from copper nanoparticles obtained by laser ablation" J. Phys. Chem. C (Mar. 2011) 115, 5021-5027.
Saito et al. "Copper nanoparticles fabricated by laser ablation in polysiloxane" Optical Materials, vol. 30, Issue 7 (Mar. 2008) pp. 1201-1204.
Salavati-Niasari et al "A novel precursor for synthesis of metallic copper nanocrystals by thermal decomposition approach" Applied Surface Science, vol. 256, Issue 12, 2010, pp. 4003-4008.
Salzemann et al. "Anisotropic copper nanocrystals synthesized in a supersaturated medium: nanocrystal growth" Langmuir. (Dec. 21, 2004) ;20(26):11772-7.
Solanki et al. "Synthesis of copper sulphide and copper nanoparticles with microemulsion method" Solid State Sciences, vol. 12, Issue 9, 2010 pp. 1560-1566.
Togaschi et al. "Solvent-free synthesis of monodisperse Cu nanoparticles by thermal decomposition of an oleylamine-coordinated Cu oxalate complex" Dalton Transactions (Apr. 2018) vol. 47, No. 15, pp. 5342-5347.

* cited by examiner

METHOD TO FORM COPPER NANOPARTICLES

FIELD OF THE INVENTION

The present invention relates to a method to form copper nanoparticles. The invention further relates to copper nanoparticles obtainable by such method and to formulations comprising such copper nanoparticles. The invention also relates to the use of formulations comprising such nanoparticles as conductive ink and to a method to form a copper film using such formulations.

BACKGROUND ART

Printing of electrically conductive patterns attracted considerable interest during recent years. Typically, electrically conductive patterns are printed by using inks comprising a conductive filler. Ink formulations based on silver nanoparticles are well known. Printing of electrically conductive patterns using ink formulation based on silver nanoparticles allow to obtain high-conductivity patterns. However, the high cost of the raw material limits large-scale application of silver-based conductive inks.

As copper has similar electrical resistivity and thermal conductivity as silver, whilst being far more abundant and inexpensive, conductive inks comprising copper nanoparticles appeared to be an alternative for conductive inks comprising silver nanoparticles. Copper has however the disadvantage to be far more sensitive to oxidation than silver. Oxidation of copper nanoparticles should be avoided in order to maintain its conductivity. Hence, a method of producing copper nanoparticles in its zero-valence state on a large scale thereby preventing oxidation—and the concomitant loss in conductivity—is a major issue to develop cost efficient copper-based inks.

Recently several literature reports were published on the synthesis of copper nanoparticles. Methods known in the art comprise amongst others chemical reduction [reference 1-3], thermal decomposition [references 4-5], micro-emulsion [reference 6], laser ablation [reference 7-8] or wire explosion [reference 9].

Common problems encountered in most of these methods are the limited amount of conductive material produced per volume of reaction and the questionable scalability of the described method. These problems cast doubts on the economic feasibility of implementing such methods in industrial processes.

Wet chemical synthesis methods such as chemical reduction or thermal decomposition are currently the most important synthesis methods. Chemical reduction methods require the use of strong reducing agents such as hydrazine or sodium borohydrate to reduce copper salts. The use of hazardous reducing agents is a matter of concern in particular for large scale production of copper nanoparticles.

Lee et al. [reference 1] describes a large scale (5L), high throughput (0.2 M) synthesis method to form copper nanoparticles under ambient atmosphere by the chemical reduction of copper sulphate.

Although thermal decomposition methods do not require the use of additional reducing agents, thermal decomposition methods generally require to work in a protective atmosphere. Furthermore thermal decomposition methods known in the art only allow to produce low amounts of material per synthesis volume.

CN106583712 describes a method to synthesize copper nanoparticles by thermal decomposition of copper formate in liquid paraffin in the presence of oleylamine. The solution is purged with nitrogen to remove oxygen from the solution.

Takanari Togashi et al [reference 10] describes a method to synthesize copper nanoparticles by first preparing an oleylamine—copper oxalate complex and by subsequently mixing the dried oleylamine—copper oxalate complex with oleylamine.

Although methods known in the art allow to produce valuable material suitable to apply as a conductive film, the use of external reducing agents and/or additives and/or the need to work in a protective atmosphere is complicating the synthesis method and is increasing the production costs. Moreover, the throughput of these methods remains insufficient to consider such methods as relevant methods allowing industrial upscaling.

Therefore, there is a need to provide a method to form copper nanoparticles avoiding the problems of the prior art and in particular to provide a method to form copper nanoparticles at a large scale in a cost-efficient way.

REFERENCES (1) Lee, Y.; Choi, J. R.; Lee, K. J.; Stott, N. E.; Kim, D. Nanotechnology 2008, 19 (41), 415604.
(2) Lisiecki, I.; Billoudet, F.; Pileni, M. P. J. Phys. Chem. 1996, 100 (10), 4160-4166.
(3) Salzemann, C.; Lisiecki, I.; Urban, J.; Pileni, M. P. Langmuir 2004, 20 (26), 11772-11777.
(4) Salavati-Niasari, M.; Mir, N.; Davar, F. Appl. Surf. Sci. 2010, 256 (12), 4003-4008.
(5) Mott, D.; Galkowski, J.; Wang, L.; Luo, J.; Zhong, C. J. Langmuir 2007, 23 (10), 5740-5745.
(6) Solanki, J. N.; Sengupta, R.; Murthy, Z. V. P. Solid State Sci. 2010, 12 (9), 1560-1566.
(7) Saito, M.; Yasukawa, K.; Umeda, T.; Aoi, Y. Copper nanoparticles fabricated by laser ablation in polysiloxane. Opt. Mater., 2008, 30, 120-1204.
(8) Muniz-Miranda, M.; Gellini, C.; Giorgetti, E. Surface-enhanced Raman scattering from copper nanoparticles obtained by laser ablation. J. Phys. Chem. C 2011, 115, 5021-5027.
(9) Kawamura, G.; Alvarez, S.; Stewart, I. E.; Catenacci, M.; Chen, Z.; Ha, Y. C. Sci. Rep. 2 015, 5, 1-8.
(10) Takanari Togaschi et al, Solvent-free synthesis of monodisperse Cu nanoparticles by thermal decomposition of an oleylamine-coordinated Cu oxalate complex, Dalton Transactions, Vol. 47, no. 12, p. 5342-5347.

SUMMARY OF THE INVENTION

It is an object of the present invention to provide a method to form copper nanoparticles in a cost efficient way.

It is another object of the present invention to provide a method to form copper nanoparticles that can be performed under a non-protective atmosphere.

It is a further object of the present invention to provide a method to form copper nanoparticles that can be performed under atmospheric conditions.

Furthermore it is an object of the present invention to provide a method that allows large solid loading of copper precursor and thus allows to obtain a high amount of copper particles per reaction volume.

It is also an object of the present invention to provide a method using a copper precursor and stabilizer in a molar ratio of 1:3, 1:2 or 1:1.

Additionally, it is an object of the present invention to provide a method allowing to tune the size of the obtained nanoparticles.

It is furthermore an object of the present invention to provide copper nanoparticles having a high copper content.

According to a first aspect of the present invention, a method to form copper nanoparticles is provided. The method comprises the steps of
a) providing a solution at temperature T0, the solution comprising
  i. a copper precursor comprising at least one neat copper carboxylate;
  ii. a stabilizer comprising at least one amine; and
  iii. optionally a solvent.
  The concentration of the copper precursor in the solution is at least 0.2 M, and preferably at least 0.5 M, and the concentration of the stabilizer in the solution is equal to or larger than the concentration of the copper precursor.
b) heating the solution of step a) to a temperature T1 at which temperature the copper precursor starts to be decomposed to form metallic copper ($Cu^0$);
c) heating the solution of step b) to a temperature T2 to form copper nanoparticles having a size of at least 4 nm, with the temperature T2 being at least 10° C. higher than the temperature T1, whereby the temperature of the solution is increased from the temperature T1 to the temperature T2 with an average rate of at least 2 degrees per minute.

The size of the copper nanoparticles is preferably determined by analysing images obtained by transmission electron microscopy (TEM), for example by analysing images obtained using a Cs-corrected JEOL 2200-FS transmission electron microscope operated at 200 kV. The size of a nanoparticle may refer to the width, height, length, diameter or equivalent diameter of a nanoparticle. In particular, the size of nanoparticles (for example width, height, length diameter or equivalent diameter) is determined by determining the size (for example width, height, length diameter or equivalent diameter) of the 2D projected images of nanoparticles as seen on TEM micrograph, for example obtained using a Cs-corrected JEOL 2200-FS transmission electron microscope operated at 200 kV. The size refers to the average size obtained by analysing a plurality of n particles, with n being at least 100. Consequently, the width refers to the average width, the height to the average height, the length to the average length, the diameter to the average diameter and the equivalent diameter to the average equivalent diameter obtained by analysing a plurality of n particles, with n being at least 100.

The copper precursor comprises at least one neat copper carboxylate. Copper carboxylates are defined as salts of a carboxylic acid and comprise for example copper formate, copper acetate, copper lactate, copper oxalate and copper citrate. A preferred copper precursor comprises copper formate ($Cu(HCO_2)_2$).

A neat copper carboxylate is a copper carboxylate not being coordinated by a complexing agent or ligand other than carboxylate ligand(s). In other words a neat copper carboxylate is apart from the carboxylate not coordinated by a complexing agent or ligand. In particular, a neat carboxylate is not forming a complex with one or more amine ligands, such as for example oleylamine ligands.

Preferred neat carboxylates comprise neat copper formate, neat copper copper acetate, neat copper lactate, neat copper oxalate and neat copper citrate. Neat copper formate is not being coordinated by a complexing agent or ligand other than formate ligand(s) and is in particular not being coordinated by one or more amine ligands as for example one or more oleylamine ligands. Similarly neat copper acetate, neat copper lactate, neat copper oxalate, neat copper citrate are not being coordinated by a complexing agent or ligand other than respectively acetate ligand(s), lactate ligand(s), oxalate ligand(s) and citrate ligand(s), and in particular not being coordinated by one or more amine ligands as for example one or more oleylamine ligands. A particularly preferred copper precursor used in the present method comprises neat copper formate ($(Cu(HCO_2)_2)$).

The copper precursor is present in the solution of step a) in a concentration of at least 0.2 M. More preferably, the copper precursor is present in the solution of step a) in a concentration of at least 0.5 M, for example in a concentration of at least 0.6 M, 0.7 M or 1 M.

The solution of step a) may comprise one copper precursor or a combination of different copper precursors. In case the solution comprises more than one precursor, the concentration of the copper precursor is the total concentration of the different copper precursors.

Preferably, all the copper precursors present in the solution comprise neat copper carboxylate, for example neat copper formate and/or neat copper acetate and/or neat copper lactate and/or neat copper oxalate and/or neat copper citrate.

In some embodiments the copper precursor consists of neat copper formate, neat copper acetate, neat copper lactate, neat copper oxalate or neat copper citrate. A particularly preferred copper precursor used in the present method consists of neat copper formate ($(Cu(HCO_2)_2)$).

The stabilizer functions as a complexing agent to bring the copper precursor in solution and reduces the decomposition temperature of the copper precursor-stabilizer complex. The decomposition temperature of the copper precursor or of the copper precursor-stabilizer complex is defined as the temperature at which the copper precursor starts to form metallic copper ($Cu^0$).

The stabilizer comprises an amine, for example a primary or secondary amine, in particular a primary or secondary aliphatic amine. The amines may comprise for example aromatic or heterocyclic amines.

Preferred examples comprise C1-C30 alkyl amines and more preferably C8-C20 alkyl amines. A particular preferred example comprises oleylamine ($OINH_2$).

The solution of step a) may comprise one stabilizer or may comprise a combination of different stabilizers. In case the solution comprises more than one stabilizer, the concentration of the stabilizer is the total concentration of the different stabilizers.

In preferred embodiments the stabilizer consists of one amine, for example a C1-C30 amine, as for example a C8-C20 alkyl amine. In particular preferred embodiments the stabilizer consists of oleylamine. Preferably, the concentration of the amine, for example the concentration of oleylamine in the solution of step a) is at least 0.2 M, more preferably at least 0.5 M.

The concentration of the stabilizer in the solution of step a) is preferably equal to or larger than the concentration of the copper precursor. More preferably, the concentration of the stabilizer in the solution of step a) ranges between 1 and 10 times the concentration of the copper precursor, for example between 1 and 6 times the concentration of the copper precursor or between 1 and 4 times the concentration of the copper precursor, for example 2 times or 3 times the concentration of the copper precursor.

In preferred embodiments the concentration of the C1-C30 alkyl amine in the solution of step a) ranges between 1 and 10 times, for example between 1 and 4 times the concentration of the copper precursor in the solution of step a).

In particularly preferred embodiments the concentration of oleylamine in the solution of step a) ranges between 1 and 10 times, for example between 1 and 4 times, the concentration of the copper precursor, for example the concentration of copper formate.

In a preferred example the copper precursor, for example copper formate, is present in a concentration of 0.2 M and the stabilizer, for example oleylamine, is present in a concentration between 0.2 M and 2 M, for example in a concentration of 0.5 M, 1 M or 1.5 M.

In a particularly preferred example the copper precursor, for example copper formate, is present in a concentration of 0.5 M and the stabilizer, for example oleylamine, is present in a concentration between 0.5 M and 2 M, for example in a concentration of 1 M or 1.5 M.

As solvent (if present) a non-coordinating solvent is preferred, i.e. a solvent that is not interacting with the copper precursor nor with the stabilizer. The solvent is preferably an apolar solvent. Preferably, the solvent has a boiling temperature higher than 160° C. A preferred solvent comprises dodecane.

Preferably, the solution does not comprise a polar solvent as for example an alcohol.

The solution of step a) comprising the copper precursor, the stabilizer and optionally the solvent has a temperature T0 or is kept at a temperature T0. Temperature T0 is for example room temperature. In any case temperature T0 is below the decomposition temperature of the copper precursor-stabilizer complex. Preferably, the temperature T0 is below 100° C.

Preferably, step a) comprises stirring of the solution to enhance dissolution of the copper precursor.

Optionally, the solution of step a) is heated to an intermediate temperature, i.e. a temperature between T0 and T1 to (further) enhance the dissolution of the copper precursor. The solution is for example heated to an intermediate temperature of about 60° C. or to a temperature of about 70° C., preferably while being stirred.

The solution of step a) is heated in step b) to a temperature T1 at which temperature the copper precursor starts to form metallic copper) ($Cu^0$). The formation of metallic copper can be monitored by observing the change of color of the solution changing from deep blue to dark red/brown. The temperature T1 is usually higher than 100° C., for example 120° C. It is clear that the temperature T1 is lower than the decomposition temperature of the copper precursor, i.e. the copper precursor without the stabilizer.

The solution of step b) is heated in step c) to a temperature T2 to form copper nanoparticles of a size of at least 4 nm, for example a size ranging between 10 and 500 nm. The temperature T2 is at least 10° C. higher than the temperature T1. More preferably, the temperature T2 is at least 15° C. higher than the temperature T1, for example at least 20° C. higher, at least 25° C. or at least 30° C. higher than the temperature T1.

In particular examples temperature T1 is 120° C. and temperature T2 is 130° C., temperature T1 is 120° C. and temperature T2 is 140° C., temperature T1 is 120° C. and temperature T2 is 150° ° C. or temperature T1 is 120° C. and temperature T2 is 160° C.

The temperature is increased from the temperature T1 to the temperature T2 with an average rate of at least 2° C. per minute, for example with an average rate of at least 3° C. per minute, an average rate of at least 6° C. per minute, an average rate of at least 10° C. per minute or an average rate of at least 20° C. per minute.

By controlling the temperature T1 and the temperature T2 and the rate to increase the temperature from temperature T1 to temperature T2, the intake of oxygen in the copper nanoparticles can be limited or avoided even when the reaction is performed in an atmosphere comprising oxygen.

The method according to the present invention may further comprise the following additional step:
d) keeping the solution at the temperature T2 during a certain time period, for example during at least 5 minutes, more preferably during at least 10 minutes to ensure the formation of the copper nanoparticles.

Furthermore the method may comprise a further step e), i.e. a step after step c) or after step d) (if step d) is present). Step e) comprises
e) collecting the copper nanoparticles from the solution obtained in step c) or obtained in step d).

To collect the copper nanoparticles from the solution any method known in the art can be considered.

Compared to methods known in the art, the method according to the present invention has the advantage that the method according to the present invention does not require a reducing agent.

Additionally, the method according to the present invention is a straight-forward, cost-efficient method to form copper nanoparticles that allows to obtain high concentrations.

The method according to the present invention also allows to tune the size of the copper nanoparticles. The size of copper nanoparticles is an important characteristic for example to be suitable for use in conductive inks. Large nanoparticles, for example nanoparticles having a size larger than 50 nm or larger than 100 nm, can clog the nozzles of a printer, for example the nozzles of an ink-jet printer. On the other hand, smaller nanoparticles have a large surface-to-volume ratio and thus require large amounts of organic ligands to stabilize a conductive ink.

Furthermore the method according to the present invention has the advantage that a protective environment is not required to perform the reaction. The method according to the present invention allows to form copper nanoparticles in an atmosphere comprising oxygen (air) and allows to form copper nanoparticles under atmospheric conditions.

The method according to the present invention furthermore has the important advantage that the method can be performed in an atmosphere comprising oxygen, for example under atmospheric conditions. Therefore, the method according to the present invention does not require to work under an inert atmosphere or does not require to evacuate oxygen from the solution, for example by bubbling nitrogen through the solution. As working in a specialized environment is not required, the method according to the present invention is more cost-efficient compared to methods known in the art.

The method according to the present invention allows to form copper nanoparticles starting from a copper precursor for example neat copper formate, and a stabilizer, for example oleylamine in a molar ratio 1:3, 1:2 or 1:1.

The high solid loading of the copper precursor in combination with the controlled heating according to the method according to the present invention allows to provide a method to form copper nanoparticles with no or a minimal intake of oxygen even when the reaction is performed in an atmosphere comprising oxygen.

A first source of oxygen present in the mixture is the oxygen initially dissolved in the mixture at the start of the reaction. Although the amount of dissolved oxygen in the solution can be limited or avoided by an initial degassing step, such degassing seems futile when working in an atmosphere comprising oxygen.

The dissolved oxygen $O_{2(sol)}$ may result in the oxidation of metallic copper to form copper oxide according to reaction (1)

$$4\ Cu_{(s)} + O_{2(sol)} \rightleftarrows 2Cu_2O_{(s)} \qquad (1)$$

A second source of oxygen is the influx of oxygen from the ambient surroundings according to reaction (2).

$$O_{2(g)} \rightleftarrows O_{2(sol)} \qquad (2)$$

As the already dissolved oxygen is consumed by reaction (1) the redissolution of oxygen according to reaction (2) will be promoted.

Although applicant does not want to be bound by any theory, the high concentration of the copper precursor in combination with the controlled heating from temperature T1 to temperature T2 as required by claim 1, allows to provide a method to form copper nanoparticles with no or a minimal intake of oxygen even when the reaction is performed in an atmosphere comprising oxygen. Further increasing the concentration of the copper precursor and/or further increasing the temperature T2 or the average rate to increase the temperature T1 to T2 may further reduce the oxygen intake in the copper nanoparticles of the present invention.

According to a second aspect of the present invention, copper nanoparticles obtainable by the method to form nanoparticles described above are provided. The copper nanoparticles have preferably at least one of their dimensions, for example their width, their height, length and/or their (equivalent) diameter in the range from 1 nm and 1000 nm, and more preferably in the range from 2 nm to 500 nm, in the range from 4 nm to 500 nm, or in the range 10 nm to 100 nm. Preferred copper nanoparticles have a diameter or equivalent diameter ranging between 1 nm and 1000 nm and more preferably between 2 nm and 500 nm as for example between 4 nm and 500 nm or between 10 nm and 100 nm.

The size of a nanoparticle, for example the width, height, length and/or (equivalent) diameter of a nanoparticle can be determined using Transmission Electron Microscopy (TEM) or Scanning Electron Microscopy (SEM). The size of a nanoparticle is for example determined by analysing images obtained using a Cs-corrected JEOL 2200-FS transmission electron microscope operated at 200 kV. In particular, the size of the nanoparticles is determined by determining the size (the width, height, length and/or (equivalent) diameter) of the 2D projected images of nanoparticles as seen on TEM micrographs, for example obtained using a Cs-corrected JEOL 2200-FS transmission electron microscope operated at 200 kV. The size refers to the average size obtained by analysing a plurality of n particles, with n being at least 100. Consequently, the width refers to the average width, the height to the average height, the length to the average length, the diameter to the average diameter and the equivalent diameter to the average equivalent diameter by analyzing a plurality of n particles, with n being at least 100.

Nanoparticles may have any shape. They may for example be spherical, elliptical, rod-like shaped, pyramidal, branched, or may have an irregular shape.

Nanoparticles can amongst others also be referred to as nanocrystals, nanospheres, nanorods, nanowires, nanodiscs, branched nanoparticles and multipods.

The nanoparticles obtainable by the method as described above may be of a single type of nanoparticles or may comprise different types of nanoparticles, for examples nanoparticles having a different size or a different shape.

The copper nanoparticles according to the present invention preferably have a copper content of at least 90 wt %, more preferably of at least 95 wt %, at least 97 wt %, at least 98 wt % or at least 99 wt %.

According to a third aspect of the present invention, a formulation comprising copper nanoparticles obtainable by the method to form nanoparticles described above is provided.

The formulation comprises for example an ink formulation. For the purpose of this invention the term 'ink formulation' refers to a composition suitable to be applied on a substrate for obtaining a pattern on this substrate. The composition is preferably applied on the substrate by a printing technique.

A formulation comprising copper nanoparticles according to the present invention has the advantage to have a high copper content. The copper content of a formulation according to the present invention has for example a copper content between 10 and 90 wt %. In other embodiments, the formulation comprises between 20 and 80 wt % copper nanoparticles.

The formulation, such as the ink formulation, can be provided as dispersion, for example in liquid form or as a paste.

The formulation, such as the ink formulation, may further comprise at least one liquid carrier. As liquid carrier water or an aqueous based liquid carrier can be considered. Other examples comprise glycol ethers, glycol ether acetates, alcohols and mixtures thereof. It is clear that solvent-free formulations, for example solvent-free ink formulations can be considered as well.

The formulation, such as the ink formulation may comprise additional components.

In some embodiments the formulation, for example the ink formulation, comprises at least one stabilizer, for example between 0.1 and 30 wt % stabilizer.

The formulation, such as the ink formulation, may further comprise a binder, a wetting agent, a humectant, a co-solvent, a pH adjusting agent, a leveling agent and/or other additives.

The formulation, such as the ink formulation, is suitable to be applied on a substrate to form a copper film. The formulation can be applied in a highly controlled way and allows to apply a copper film with an intricate design. In particular, the formulation, such as the ink formulation is suitable to be applied on a substrate by a printing technique, for example ink-jet printing, flexography printing, screen printing, gravure printing or offset printing.

According to a fourth aspect of the present invention, the use of a formulation comprising copper nanoparticles as ink formulation, in particular as conductive printing ink is provided.

According to a fifth aspect of the present invention, a method to form a copper film is provided. The method comprises the steps of
a) applying a formulation comprising copper nanoparticles as described above onto a substrate to provide a copper film, and
b) optionally subjecting the copper film to a drying treatment and/or to a heat treatment.

Any technique to apply copper nanoparticles can be considered. Preferred techniques comprise printing techniques, for example ink-jet printing, flexography printing, screen printing, gravure printing or offset printing.

The substrate can be any type of substrate allowing the application of a copper film. Substrates may for example comprise flexible substrates, rigid substrates, stretchable substrates, pliable substrates, conductive substrates, nonconductive substrates, colored substrates and transparent substrates.

Examples of substrates comprise metal substrates, glass substrates, paper substrates, semiconductor substrates, polymeric substrates, ceramic substrates or any combination thereof.

The copper film is preferably applied in a pattern. The term 'pattern' refers a film formed on a substrate having any shape or any size. The term pattern includes a plurality of shapes, either identical or not identical, distributed ad random or in an ordered manner on the substrate. The term includes amongst others lines, letters, numeral, symbols, electrical circuits.

As drying treatment any drying treatment of copper films known in the art can be considered.

As heat treatment any heat treatment of copper films known in the art can be considered. Examples of heat treatments comprise sintering, for example laser sintering or infrared sintering.

The copper film is preferably applied in a pattern. The term 'pattern' refers a film formed on a substrate having any shape or any size. The term pattern includes a plurality of shapes, either identical or not identical, distributed ad random or in an ordered manner on the substrate. The term includes amongst others lines, letters, numeral, symbols, electrical circuits.

The copper film has preferably a bulk conductivity of at least 3%, more preferably at least 5% or at least 10%.

The term 'bulk conductivity' or 'percentage bulk conductivity' refers to the electrical conductivity of the pattern relative to the electrical weight conductivity of the bulk copper measured in the same conditions.

Articles comprising a copper film obtainable by applying copper particles according to the present invention comprise for example solar cells, EMI shieldings, RFID tags, electroluminescent devices, OLEDs, LCDs, touch screens, antennas, PCBs or any other device requiring electrodes.

BRIEF DESCRIPTION OF THE DRAWINGS

The present invention will be discussed in more detail below, with reference to the attached drawings, in which.

DESCRIPTION OF EMBODIMENTS

Figure 1A:
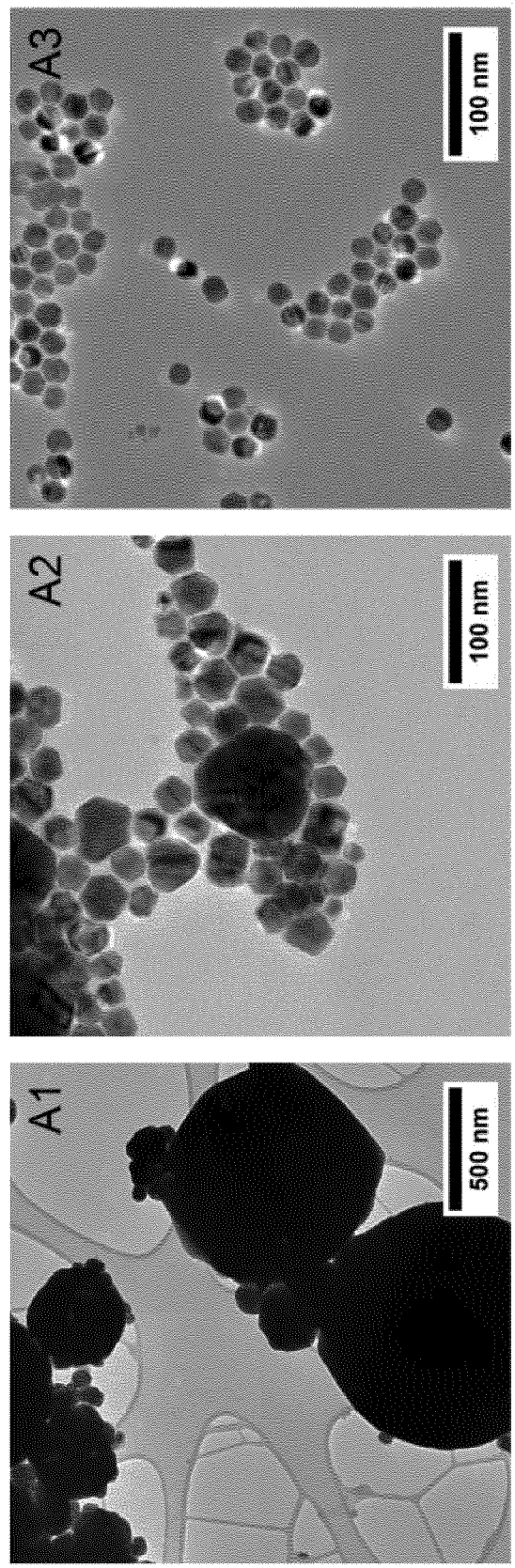
FIG. 1a, FIG. 1b and FIG. 1c show Transmission Electron Microscope (TEM) images of copper nanoparticles synthesized by the method according to the present invention.

The present invention will be described with respect to particular embodiments and with reference to certain drawings but the invention is not limited thereto but only by the claims. The drawings are only schematic and are non-limiting. The size of some of the elements in the drawing may be exaggerated and not drawn on scale for illustrative purposes. The dimensions and the relative dimensions do not correspond to actual reductions to practice of the invention.

When referring to the endpoints of a range, the endpoints values of the range are included.

When describing the invention, the terms used are construed in accordance with the following definitions, unless indicated otherwise.

The term 'and/or' when listing two or more items, means that any one of the listed items can by employed by itself or that any combination of two or more of the listed items can be employed.

The term 'complex' or 'coordinating complex' refers to a central (metal) atom surrounded by molecules or anions, known as ligands.

The term 'ligands' or 'complexing agents' refers to neutral molecules or ions bonding to a central (metal) atom or ion to form a complex or coordinating complex.

EXAMPLES

First Series of Examples

In a first series of examples, solutions were prepared by mixing copper(II) formate tetrahydrate and oleylamine in n-dodecane at room temperature (T0) in concentrations as shown in Table 1. The reagents were stirred for 1 hour at 60° C. to ensure that copper(II) formate tetrahydrate is fully dissolved (deep blue color). The temperature was increased to 60° C. to accelerate the dissolution. It is however important to not surpass 100° C. to avoid decomposition of Cu(II) formate tetrahydrate.

Subsequently, the temperature of the solution was increased to a temperature of 120° C. (T1) and the solution turned to dark red/brown. Subsequently, the temperature of the solution was increased to a temperature of 140° C. (T2). The temperature was increased from 120° C. (T1) to a 140° C. (T2) with an average rate of 10° C./minute. The solution was then maintained at a temperature of 140° C. for at least 10 minutes to ensure that all copper(II) formate has been reduced. Finally, the resulting solution was washed multiple times using acetonitrile, methanol or ethanol as non-solvents and hexane or toluene as solvents.

Figure 1B:
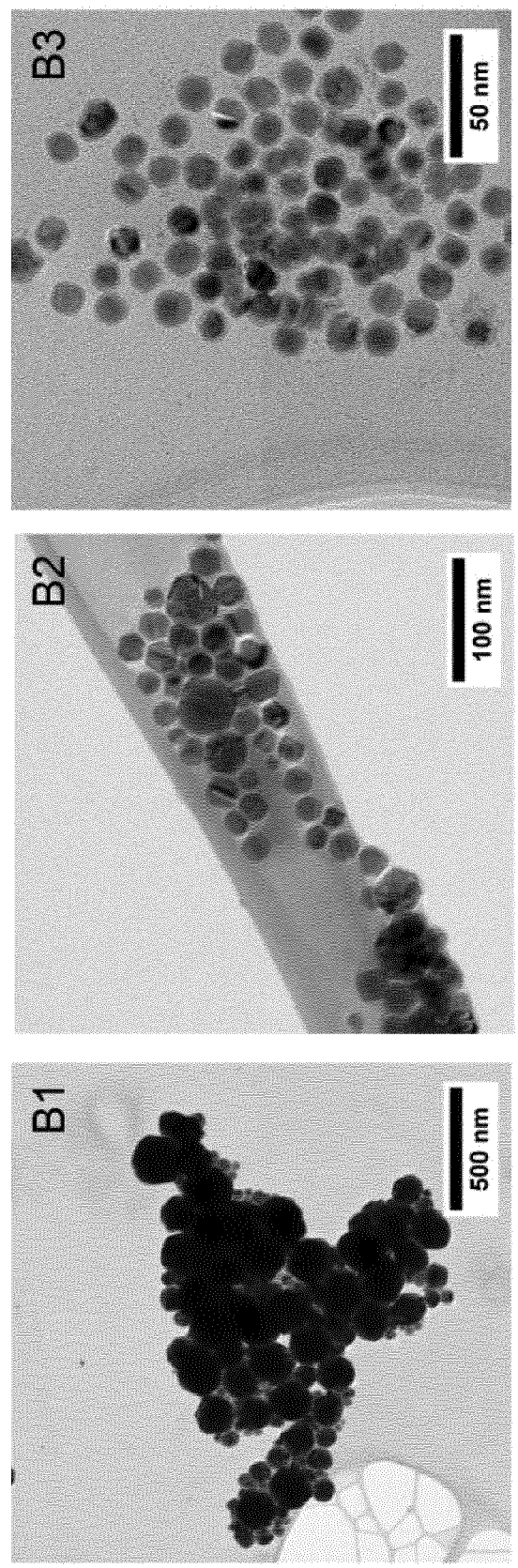
Figure 1C:
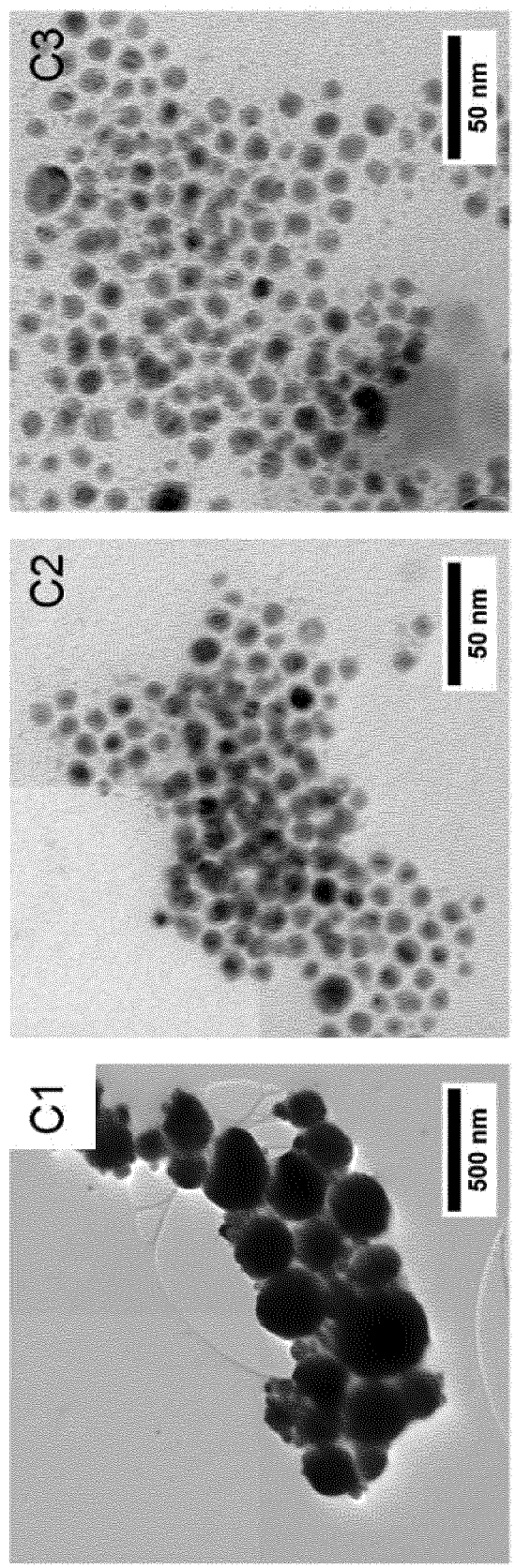

Transmission Electron Microscope (TEM) images of the obtained copper nanoparticles are shown in FIG. 1a (Examples A1-A3), FIG. 1b (Examples B1-B3) and FIG. 1c (Examples C1-C3).

The size of the nanoparticles can be influenced by changing the ratio of the concentration of the stabilizer over the concentration of the copper precursor. The higher the concentration of the stabilizer, the smaller the size of the obtained copper nanoparticles. Preferably, the ratio of the concentration of the stabilizer over the concentration of the copper precursor ranges between 1 and 8, for example between 1 and 3 as shown in Table 1.

Also the initial concentration of copper(II) formate in the solution may influence the particle size. The lower the concentration of the copper(II) formate, the larger the size of the obtained copper nanoparticles. The concentration of copper(II) formate can for example be increased to 1 M or above 1M.

All examples of the first series were performed under an atmosphere comprising oxygen.

Figure 2:
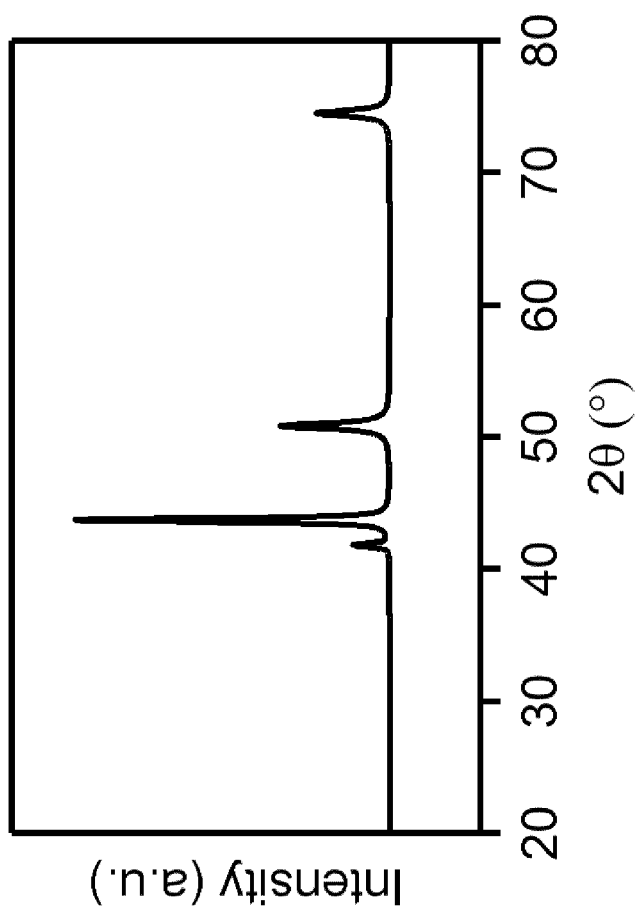
FIG. 2 shows an X-ray diffraction (XRD) pattern of copper nanoparticles synthesized according to example 1 at a copper formate and oleylamine concentration of 1M.

FIG. 2 shows a X-ray diffraction pattern of copper nanoparticles synthesized according to example 1 starting from copper formate in a concentration of 1 M and oleylamine in a concentration of 1 M.

Starting from a solution comprising copper(II) formate in a concentration of at least 0.5 M and an amine (oleylamine) in a concentration of at least 0.5 M, metallic Cu nanoparticles can be obtained by the method according to the present invention even if the reaction is performed without a protective atmosphere.

TEM images confirmed that lowering the concentration of the copper formate leads to larger copper nanoparticles.

TEM images also confirmed that the ratio of the concentration of the stabilizer over the concentration of the copper precursor influences the size of the nanoparticles : a higher ratio results in smaller copper nanoparticles.

TABLE 1

| Example | Concentration copper formate (M) | Ratio concentration oleylamine/ concentration copper formate ([oleylamine]:[copper formate]) |
|---|---|---|
| A1 | 0.157M | 1:1 |
| A2 | 0.157M | 2:1 |
| A3 | 0.157M | 3:1 |
| B1 | 0.315M | 1:1 |
| B2 | 0.315M | 2:1 |
| B3 | 0.315M | 3:1 |
| C1 | 0.630M | 1:1 |
| C2 | 0.630M | 2:1 |
| C3 | 0.630M | 3:1 |

Second Series of Examples

In a second series of examples copper nanoparticles (nanocrystals) were prepared following the method of example 1 using copper formate as copper precursor and using different stabilizers in a 2:1 ratio with the precursor : octylamine (example D), di-octylamine (example E), dodecylamine (example F), hexadecylamine (example G) as indicated in Table 2. Details of examples 2 to 5 are summarized in Table 2. For all examples the temperature T2 is equal to T1+20° C. The stabilizers of examples D to G were all suitable to obtain copper nanoparticles.

TABLE 2

| | concentration copper formate (M) | Stabilizer | T1 | $Cu^0$ nanoparticle formation? |
|---|---|---|---|---|
| Example D | 0.630M | Octylamine 8-Am | 145° C. | Yes |
| Example E | 0.630M | Dioctylamine D-8-Am | 155° C. | Yes |
| Example F | 0.630M | Dodecylamine 12-Am | 136° C. | Yes |
| Example G | 0.630M | Hexadecylamine 16-Am | 136° C. | Yes |

Third Series of Examples

Copper nanoparticles (nanocrystals) were prepared following the method of example 1 using oleylamine as stabilizer but using different copper precursors: copper acetate (example H), copper acetylacetonate (example I) as indicated in Table 3. Oleylamine is present in a 2:1 ratio with the precursor. Table 3 further specifies the temperature T1 for the different examples. For all examples the temperature T2 is equal to T1+20° C. The copper precursor of example H was suitable to obtain copper nanoparticles. Copper nanoparticles could not be obtained using the copper precursor of example I.

TABLE 3

| | Copper precursor | Stabilizer | T1 | $Cu^0$ nanoparticle formation? |
|---|---|---|---|---|
| Example H | Copper acetate | Oleylamine | 185° C. | Yes |
| Example I | Copper acetylacetonate | Oleylamine | / | No |

Fourth Series of Examples

Copper nanoparticles (nanocrystals) were prepared as described in the first series of examples but in larger concentrations and volumes. A 1 M solution of copper formate was prepared mixing the copper precursor with 32.9 mL of oleylamine (1 M) and 67.1 mL of dodecane. The temperature of the solution was raised following the same temperature scheme described in the first series of examples but with an average increase of the temperature of 5° C. per minute. The average diameter of the nanoparticles obtained was 120 nm.

The particles obtained by this method were washed twice by using a mixture of toluene and ethanol and centrifuged at 2000 rpm for 5 minutes. The resulting dry powder of Cu nanoparticles (50% in weight) were mixed with diacetone alcohol as solvent and Byk-333 (0.3%) and Disperbyk-180 (4%) as additives and sonicated for 1 hour. The resulting ink was deposited using a wire bar and sintered in a nitrogen-filled oven at 500° C. for 1 hour. The obtained copper films had a resistivity of 2.57 µΩ cm, corresponding to 66% of bulk Cu conductivity.

Fifth Series of Examples

Copper nanoparticles (nanocrystals) were prepared as described in the fourth series of examples but in even larger volume. A 1 M solution of copper formate was prepared mixing the copper precursor with 329 mL of oleylamine (1 M) and 671 mL of dodecane. The temperature of the solution was raised following the same temperature scheme described in the first series of examples but with an average increase of the temperature of 2.5° C. per minute. The average diameter of the nanoparticles obtained was 240 nm.

The invention claimed is:
1. A method of forming nanoparticles consisting of metallic copper, which method does not require a reducing agent to reduce copper formate, the method comprising the steps of:
   a) providing a solution at temperature T0, the solution comprising
   i. a copper precursor comprising neat copper formate; the neat copper formate not being coordinated by a complexing agent or ligand other than formate;
   ii. a stabilizer comprising at least one amine; and
   iii. optionally a solvent;
   so as to form nanoparticles consisting of metallic copper, wherein the concentration of the copper precursor in the solution is at least 0.2 M and the concentration of the stabilizer in the solution is greater than or equal to the concentration of the copper precursor with a molar ratio of copper precursor to stabilizer being between 1:1 and 1:3;
   b) heating the solution of step a) to a temperature T1 at which temperature the copper precursor starts to decompose to form metallic copper ($Cu^0$); and c) heating the solution of step b) to a temperature T2 to form nanoparticles consisting of metallic copper and having a size of at least 4 nm, the temperature T2 being at least 10° C. higher than temperature T1, wherein the temperature of the solution is increased from temperature T1 to temperature T2 with an average rate of at least 2 degrees per minute.

2. The method according to claim 1, wherein the neat copper formate does not comprise amine ligands.

3. The method according to claim 1, wherein the amine comprises a $C_1$-$C_{30}$ alkylamine.

4. The method according to claim 1, wherein the amine consists of oleylamine present in the solution of step a) at a concentration of at least 0.2 M.

5. The method according to claim 1, wherein the solvent is present and is an apolar solvent.

6. The method according to claim 1, wherein the concentration of the copper precursor in the solution of step a) is at least 0.5 M.

7. The method according to claim 1, wherein the temperature of the solution is increased from the temperature T1 to the temperature T2 with an average rate of at least 10 degrees per minute.

8. The method according to claim 1, the method further comprising:
an additional step d) and/or an additional step e),
wherein the additional step d) comprises maintaining the solution at temperature T2 for at least 5 minutes to form nanoparticles; and
wherein the additional step e) comprises collecting nanoparticles from a reaction mixture obtained in step c).

9. The method according to claim 1, wherein the method is performed under an atmosphere comprising oxygen.

10. The method according to claim 9, wherein the method is not performed under an inert atmosphere.

11. A method of forming nanoparticles, wherein the nanoparticles consist of metallic copper, the method comprising:

(a) heating a solution under an atmosphere from a temperature T0 to a temperature T1, wherein at temperature T1 a copper precursor starts to decompose to form metallic copper ($Cu^0$),
wherein the solution comprises:
i. the copper precursor comprising neat copper formate that is not coordinated by a complexing agent or ligand other than formate;
ii. a stabilizer comprising at least one amine; and
iii an optional solvent,
wherein the concentration of the copper precursor in the solution is at least 0.2 M and the concentration of the stabilizer in the solution is greater than or equal to the concentration of the copper precursor, with a molar ratio of copper precursor to stabilizer being between 1:1 and 1:3; and (b) heating the resulting solution to a temperature T2 to form nanoparticles having a size of at least 4 nm, wherein the temperature T2 is at least 10° C. greater than temperature T1, and wherein the temperature of the solution is increased from temperature T1 to temperature T2 at an average rate of at least 2 degrees per minute so as to form nanoparticles consisting of metallic copper.

12. The method according to claim 11, the method further comprising:
c) maintaining the solution at temperature T2 for at least 5 minutes to form nanoparticles; and/or
d) collecting the nanoparticles from a reaction mixture obtained in step b).

13. The method according to claim 11, wherein, when the atmosphere comprises oxygen, the method further comprises:
(c) controlling temperature T1 and temperature T2 and the rate of increase from temperature T1 to temperature T2, so as to limit oxygen's intake into the nanoparticles.

* * * * *